United States Patent [19]

Cointot et al.

[11] Patent Number: 4,922,249
[45] Date of Patent: May 1, 1990

[54] BINARY-TO-BIPOLAR CONVERTER

[75] Inventors: Denis F. Cointot, Paris; Andre H. Cauderlier, Lieusaint, both of France

[73] Assignee: S. A. T. Societe Anonyme de Telecommunications, Paris, France

[21] Appl. No.: 146,179

[22] Filed: Jan. 20, 1988

[30] Foreign Application Priority Data

Jan. 20, 1987 [FR] France .................. 87 00568

[51] Int. Cl.⁵ .......................... H03M 5/18
[52] U.S. Cl. ...................... 341/57; 375/17; 307/263
[58] Field of Search ............ 341/56, 57, 118, 15, 341/120, 121; 307/263, 268, 260, 101; 375/4, 26, 34, 58, 17

[56] References Cited

U.S. PATENT DOCUMENTS

| | | | |
|---|---|---|---|
| 4,063,235 | 12/1977 | Ludwig | 341/68 |
| 4,121,118 | 10/1978 | Miyazaki | 375/17 |
| 4,254,501 | 3/1981 | Griffith et al. | 375/36 |
| 4,543,496 | 9/1985 | Shepler | 375/17 |
| 4,780,888 | 10/1988 | Solhjell et al. | 375/4 |
| 4,785,201 | 11/1988 | Martinez | 307/263 |

FOREIGN PATENT DOCUMENTS 58-75919  5/1983  Japan .................. 307/263
205357A 11/1983  Japan .................. 375/17

OTHER PUBLICATIONS

Recommendation I. 430 "ISDN USER-NETWORK INTERFACES", Fascicle 111.5, Section 3, International Telegraph and Telephone Consultative Committee (C.C.I.T.T.), pp. 141-177, Oct. 1984.

Primary Examiner—Vit W. Miska
Assistant Examiner—Williams H. L.
Attorney, Agent, or Firm—Laubscher, Presta & Laubscher

[57] ABSTRACT

A binary-to-bipolar converter converts two binary signals into positive and negative bipolar pulses alternately corresponding to a "1" logic state of two binary signals. The bipolar pulses are defined by the low output impedance states of two transfer gates. The main object of the invention is to reduce the transient trailing of the rear edges in the bipolar pulses. This can be obtained by delaying the drop from the low impedance state to the high output impedance state by means delaying control signals on the transfer gates, or by an integrator circuit applying calibrated pulses onto the output of the transfer gates, in response to the rear edges of the "1" logic states in the binary signals. The converter also calibrates the rise times of the bipolar pulses and allow the use of CMOS circuits upstream of the converter.

16 Claims, 5 Drawing Sheets

BINARY-TO-BIPOLAR CONVERTER

BACKGROUND OF THE INVENTION

1—Field of the invention

This invention in general relates to a conversion of two binary signals into one bipolar signal with positive or negative pulses, or marks, corresponding alternately to a first logic state of the two binary signals.

2—Description of the prior art

More particularly, the invention deals with a binary-to-bipolar converter located at the output of a transmitting part, called transmitter, of a terminal connected to a distributed transmission line in a local area network. In such a network many terminals are connected to the transmission line and must therefore have a high fan-out. This condition means that the converter must have a high output impedance during the time intervals between bipolar signal pulses and have a low output impedance during transmission of the bipolar signal pulses. When the converter is at a high impedance state, its output is considered to be "disconnected from the line" and is often said to be with "open collector".

A known converter meeting these impedance conditions comprises, on the input side, two CMOS technology tristate transfer gates and, on the output side, a balanced differential transformer. The gates have inputs raised at a positive DC voltage, control terminals receiving respectively the binary signals, and outputs transmitting the respective positive and negative pulses to two primary half-windings of the transformer.

The pulses of the bipolar signal transmitted by this known converter have rear edges, i.e., transitions from the low impedance state to the high impedance state, which vary slowly. The slow variation of the rear edges is due to the energy stored in the transformer during the pulses, energy which slowly flows out into the line load throughout the rear fronts of the bits at the first logic state, generally high of the binary signals. The fall time of the pulse rear fronts is all the greater as the load impedance is high, and disturbs the reception of the bipolar signal accordingly.

OBJECT OF THE INVENTION

The main object of the invention is to provide a binary-to-bipolar converter which reduces the transient trailing effect in the rear fronts of the bipolar signal pulses, that is, avoids or practically eliminates this transient trailing.

SUMMARY OF THE INVENTION

Accordingly, there is provided a binary-to-bipolar converter comprising:

first and second means for converting a first logic state of first and second binary signals into first and second current bipolar pulses corresponding to low output impedance states for the first and second conversion means respectively, the first logic state only being present in one of the binary signals at any one time, and each of the converting means being at a high impedance state in response to a second logic state of the respective binary signal, means for transforming the first and second pulses into opposite polarity pulses of a bipolar signal transmitted in a transmission line, and means connected to the first and second conversion means for deriving steep rear fronts in the first and second pulses.

The invention consists, in a general manner, of delaying the drop to the high output impedance of the converter either by delaying the drop to high impedance of two input transfer gates receiving respectively the binary signals and included in the converter, or by discharging the transmission line by means of a short pulse produced at the end of each of the bipolar pulses.

Apart from the reduction in transient trailing, the invention also allows to calibrate the rise and fall times of the bipolar pulses in order to avoid overwaves induced by the capacitive line load, to satisfy line impedance templates in terms of the signal frequency, to use upstream of the converter CMOS technology circuits which, by their very nature, offer low current consumption, and to protect these CMOS circuits against any power supply from the transmission line when they are not in their normal operating condition.

BRIEF DESCRIPTION OF THE DRAWINGS

The foregoing and other objects, features and advantages of the invention will be apparent from the following detailed description of several preferred embodiments of the invention with reference to the corresponding accompanying drawings in which.

DESCRIPTION OF THE PREFERRED EMBODIMENTS

Figure 1:
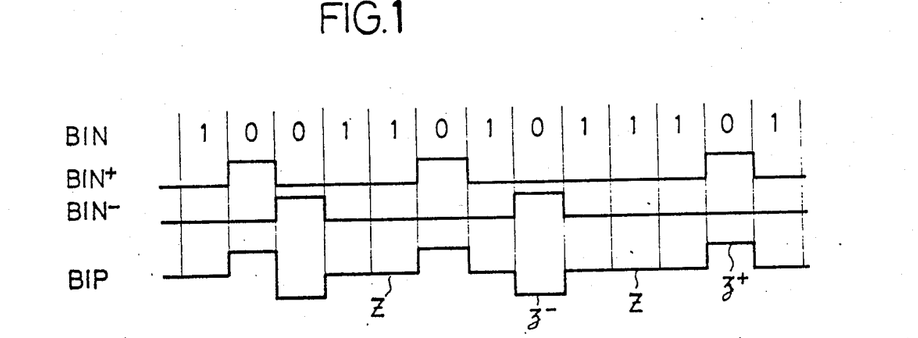
FIG. 1 shows waveforms of two incoming binary signals and one bipolar signal leaving a binary-to-bipolar converter.

Hereinafter, reference is made to a bipolar signal BIP outgoing from a binary-to-bipolar converter and derived from two component binary signals BIN+ and BIN− incoming into the converter as shown in FIG. 1. Binary signals BIN+ and BIN−, *also called as unipolar signals, result from the synchronous breakdown of a binary data signal BIN*. The "0" bits of the BIN signal alternately correspond to the first logic states "1" in the signals BIN+ *and BIN−, and one of the signals BIN+ and BIN− is at a second logic state* "0" when the other signal is at the first state "1". The binary signals BIN+ and BIN− are both at a second state "0" when binary signal BIN is at state "1".

Figure 2:
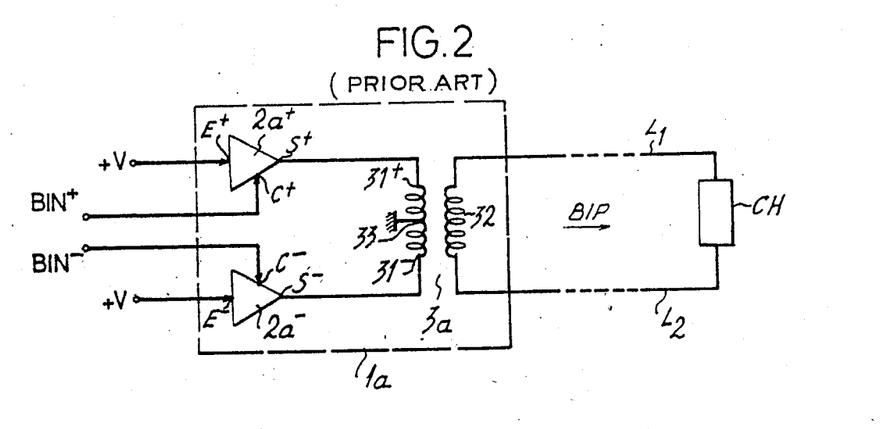
FIG. 2 shows a binary-to-bipolar converter according to the prior art.

Conversion in a binary-to-bipolar converter, such as that according to the prior art shown by reference numeral 1a in FIG. 2, uses pseudo-ternary coding. Conversion consists in converting a binary "1" of the signal BIN into a nil digit Z in the bipolar signal BIP, that reflects an absence of signal at the output of the converter and consequently a high output impedance, and in converting a binary "0" in the signal BIN into current pulses, called as positive and negative marks $z+$ and $z-$, in the BIP signal, that reflect a low output impedance of the converter. The pulses have alternating polarities, a positive pulse $z+$ corresponding to a "1" in the incoming signal BIN+ *and a negative pulse $z-$* corresponding to a "1" in the incoming signal BIN−.

Such a binary-to-bipolar conversion complies with the specifications issued by recommendation I.430 "ISDN USER-NETWORK INTERFACES", Fascicle III.5, Section 3, pages 141 to 177, October 1984, from the International Telegraph and Telephone Consultative Committee (C.C.I.T.T.). This recommendation in particular concerns a bidirectional transmission medium, or S reference point, between a linking unit connecting a user local area network and the telephone switched network, and a plurality of user terminals, called as transceivers, in an integrated services digital network (ISDN). In particular, such binary-to-bipolar converters are included in the transmitting part, called 37 transmitter", of the linking unit and in those of the terminals. A terminal is at high impedance state Z when it is in the deactivated state, i.e., when it is not energized, or when it transmits a logic "1" of the binary data signal BIN. The terminal is at the low impedance state and the active state, i.e., when it transmits a logic "0" in the binary data signal BIN. The high impedance state Z of the bipolar signal, also called "open collector", allows connection of the transmitting parts of a large number of terminals to the transmission medium, called as a distributed transmission line, since such a connection is equivalent to a logic "wired-OR" operation; thus we have $Z+Z=Z$, $Z+z=z$ and $z+z=z$. Although the invention is in particular intended for this type of application, a binary-to-bipolar converter embodying to the invention may also be used whenever binary-to-bipolar conversion is necessary; for example, this is the case at the output of a digital repeater-regenerator.

As shown in FIG. 2, the known converter 1a comprises, on the input side, two transfer gates $2a+$ and $2a-$, and on the output side, a balanced differential transformer 3a. The transfer gates are made using CMOS technology and are called as tristate gates. Gates $2a+$ and $2a-$ have inputs E+ and E− raised to a positive DC voltage +V corresponding to the peak amplitude of bipolar pulse $z+$ and $z-$, control inputs C+ and C−, called as enable inputs, respectively receiving binary signals BIN+ and BIN−, and outputs S+ and S− connected respectively to first terminals of two half-windings 31+ and 31− of transformer 3a. Other terminals of half-windings 31+ and 31− constitute a center tapping terminal 33 connected to a 0 volt reference or grounding terminal in order to loop opposing currents corresponding to pulses $z+$ and $z-$. Terminals of a secondary winding 32 of transformer 2a are connected to a load CH through two wires $L_1$ and $L_2$ of a balanced transmission line. This line can be included in a transmission bus between two terminals and one linking unit.

As is known, when a transfer gate $2a+$, $2a-$ has a control input C+, C− at level "1", corresponding in this case to state "1" in incoming signal BIN+, BIN−, the gate conducts and retransmits the logic levels of the incoming signal to input E+, E−, in this case the peak level +V of pulses $z+$, $z-$; thus thanks to the balanced primary winding 31+-31−, pulses $z+$ and $z-$ are transmitted in line $L_1$-$L_2$, in the form of a first current flowing from wire $L_1$ to wire $L_2$ through winding 32 and a second current flowing in the reverse direction to the first, respectively. When input C+, C− of a gate $2a+$, $2a-$ is at state "0", corresponding to "0" states of respective signal BIN+, BIN−, gate $2a+$, $2a-$ is not conductive and the output S+, S− if "OFF", that is has high impedance, called the third state, and corresponding to the no-current state Z of the bipolar signal BIP. However, a reciprocal convention to the previous one on the logic states of the control inputs can be adopted, according to the information given by the manufacturer of the transfer gates.

Figure 2A:
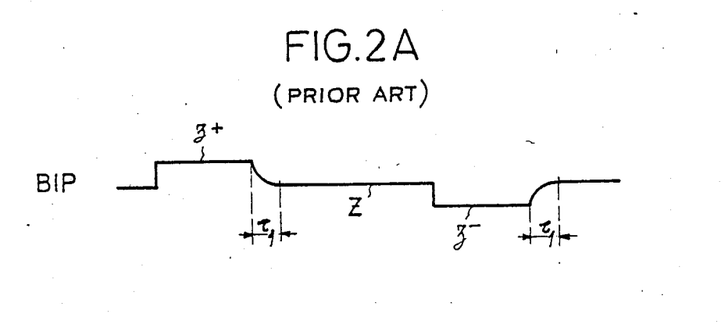
FIG. 2A shows a waveform of a bipolar signal derived by the converter in FIG. 2.

As already mentioned in the foreward to this present specification, the known converter 1a offers an output signal with pulse rear edges, i.e., transitions from state $z+$ or $z-$ to state Z, whose fall times are slow, as shown in FIG. 2A. As soon as there is a rear transition from state "1" to state "0" of control signal BIN+, BIN−, the respective transfer gate $2a+$, $2a-$ is not conductive and offers a high impedance; the energy stored in the respective primary half-winding 31+, 31− during the "1" state of signal BIN+, BIN− can only flow into load CH, which implies a time constant $\tau_1$, called transient trailing of the rear edge of pulses $z+$, $z-$, which is all the greater as the load impedance is high.

Figure 3:
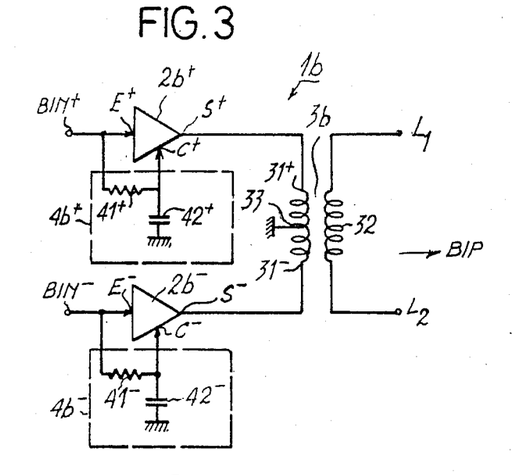
FIG. 3 shows a first embodiment of a binary-to-bipolar converter according to the invention.
Figure 3A:
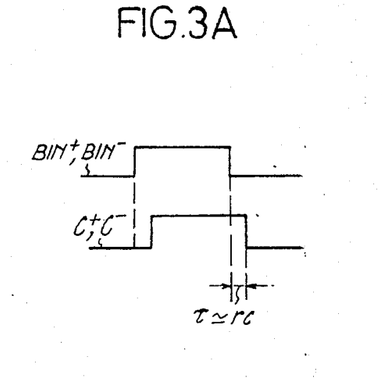
FIG. 3A shows waveforms of an incoming binary signal and a transfer gate control signal for the converter in FIG. 3.

In a first embodiment, the transient trailing of the rear edge is eliminated by delaying the binary control signals at inputs C+ and C− in relation to the signals applied to inputs E+ and E− so as to obtain a negative transition to the low impedance state. In this case, as shown in FIG. 3, a binary-to-bipolar converter 1b comprises two integrator circuits $4b+$ and $4b-$ delaying the control signals BIN+ and BIN− with at least a predetermined time $\tau$. Time $\tau$ is at least higher than the discharge time of line $L_1L_2$ through the active impedance of the converter on the line input, and is less than the previous trailing constant $\tau_1$. Each integrator circuit $4b+$, $4b-$ comprises a resistor 41+, 41− and a capacitor 42+, 42− having resistance r and capacitance c such that $rc \simeq \tau$. Converter 1b comprises two transfer gates $2b+$, $2b-$ having inputs E+ and E− that receive respective signals BIN+ and BIN− and are connected to first terminals of resistors 41+ and 41−, control inputs C+ and C− that are connected to second terminals of resistors 41+ and 41− and to the 0 volt reference terminal, through respective capacitors 42+ and 42−, and outputs S+ and S− that are connected to first terminals of primary half-windings $31^+$ and $31^-$ of a balanced transformer $3b$, similar to transformer $3a$, respectively. As shown in FIG. 3A, the changing to high impedance or state Z of a gate $2b^+$, $2b^-$ intervenes when the signal at input $E^+$, $E^-$ is at state "0", i.e. when the signal at ouput $S^+$, $S^-$ is at low impedance state for at least a time $\tau$, time that is sufficient to avoid transient trailing of rear edge.

Figure 4:
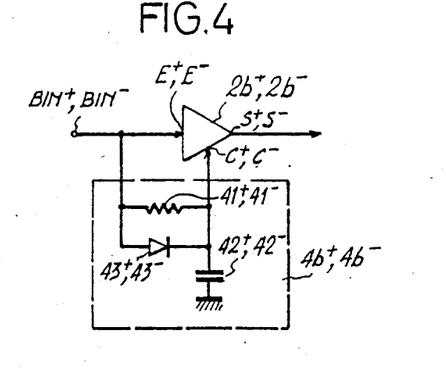
FIG. 4 shows another embodiment of the integrator circuit delaying a control signal, included in the converter of FIG. 3.
Figure 4A:
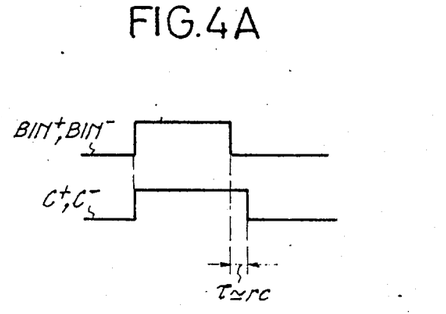
FIG. 4A shows waveforms of an incoming binary signal and a transfer gate control signal for the converter in FIG. 4.

In a version of the first embodiment, each integrator circuit $4b^+$, $4b^-$ comprises a diode $43^+$, $43^-$ connected in parallel with resistor $41^+$, $41^-$ and forwardly poled from input $E^+$, $E^-$ to control input $C^+$, $C^-$ as shown in FIG.4. Diode $43^+$, $43^-$ eliminates the delay imposed by circuit rc, $41^+$ and $42^+$, $41^-$ and $42^-$, on the rise forward edges of bipolar pulses $z^+$ and $z^-$, as shown in FIG.4A.

Figure 5:
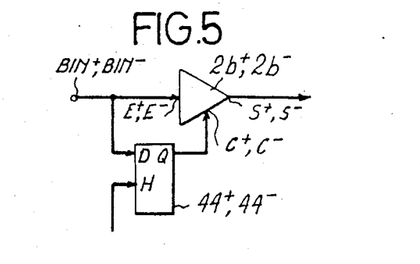
FIG. 5 shows another embodiment of the control signal delaying circuit included in the converter of FIG. 3.
Figure 5A:
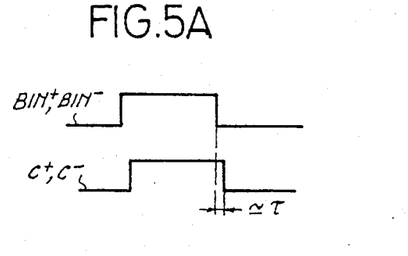
FIG. 5A shows waveforms of an incoming binary signal and a transfer gate control signal for the converter in FIG. 5.

In a second version of the first embodiment, the required delay of about $\tau$ is obtained by means of two D flip-flops $44^+$ and $44^-$, replacing integrator circuits $4b^+$ and $4b^-$, as shown in FIGS. 5 and 5A. For each flip-flop, a D input receives respective signal $BIN^+$, $BIN^-$, a clock input H receives a high-frequency clock signal, that is of a frequency appreciably higher than the bit rate of the binary signal and, preferably, more or less equal to $1/\tau$, and an output Q is connected to control input $C^+$, $C^-$ of respective transfer gate $2b^+$, $2b^-$. In practice, each flip-flop $44^+$, $44^-$ is associated with a two-input gate AND having an input receiving the respective signal $BIN^+$, $BIN^-$ and connected to the input D, another input connected to the output Q, and an output connected to the control input $C^+$, $C^-$. Each digital combination including a D flip-glop and a gate AND is thus equivalent to an integrator circuit $4b^+$, $4b^-$ shown in FIG. 3.

Figure 6:
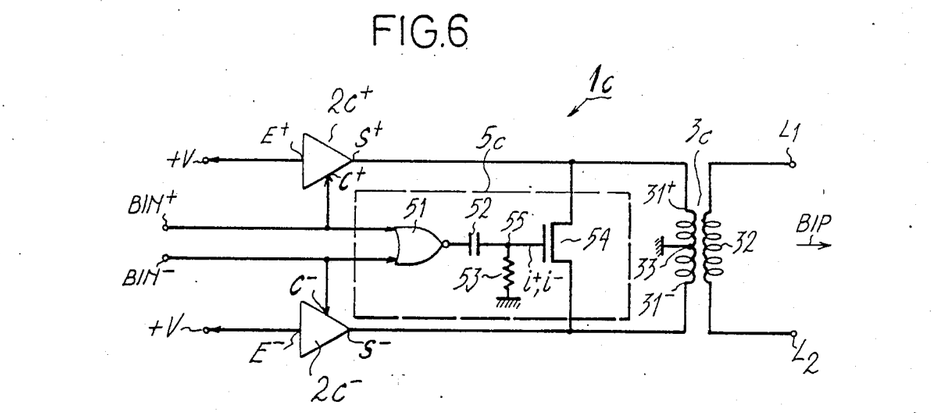
FIG. 6 shows a second embodiment of binary-to-bipolar converter according to the invention.

In a second embodiment shown in FIG. 6, a binary-to-bipolar converter $1c$ comprises two transfer gates $2c^+$ and $2c^-$ and a balanced differential transformer $3c$, laid out in the same way as those in known converter $1a$. Moreover, converter $1c$ comprises a circuit $5c$ for suppressing the transient trailing of rear edge of pulses $z^+$ and $z^-$ in bipolar signal BIP, and not to avoid such transient trailing in the same way as by integrator circuits $4b^+$ and $4b^-$.

Circuit $5c$ comprises a NOR gate 51, a differentiating circuit with capacitor 52 and resistor 53, and a field effect transistor 54. Two inputs of gate 51 receive binary signals $BIN^+$ and $BIN^-$ and are connected to control inputs $C^+$ and $C^-$ of gates $2c^+$ and $2c^-$, respectively. An output of gate 51 is connected to a gate electrode 55 of transistor 54 through capacitor 52. Gate electrode 55 is coupled to the reference terminal through resistor 53. The drain and source of transistor 54 are connected to outputs $S^+$ and $S^-$ of gates $2c^+$ and $2c^-$ and to the first terminals of primary half-windings $31^+$ and $31^-$ of transformer $3c$, respectively.

Figure 6A:
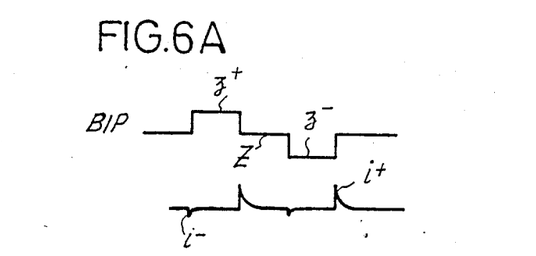
FIG. 6A shows waveforms of an outgoing bipolar signal and a FET transistor gate electrode control signal for the converter in FIG. 6.

Thus, the output of NOR gate 51 delivers a signal having fall and rise edges corresponding to the leading and trailing edges of the "1" pulses of the $BIN^+$ and $BIN^-$ signals. These latter edges produce negative pulses $i^-$ and $i^+$ through differentiating circuit 52, 52, as shown in FIG. 6A, and correspond to the direction of forward and rear edges of the binary signals. In circuit $5c$, the capacitance c of capacitor 52 and the resistance r of resistor 53 are such that $rc \cong \tau$, where $\tau$ is the transient trailing of the rear edge of bipolar pulses $z^+$ and $z^-$ to be deleted. Thus pulses $i^-$ have no effect on transistor 54 and turn it off. Pulses $i^+$ saturate transistor 54 and consequently contribute to discharging the energy stored in the inductances of transformer $3c$ when one of outputs $S^+$ and $S^-$ drops from the low impedance state to the high impedance state.

Figure 7:
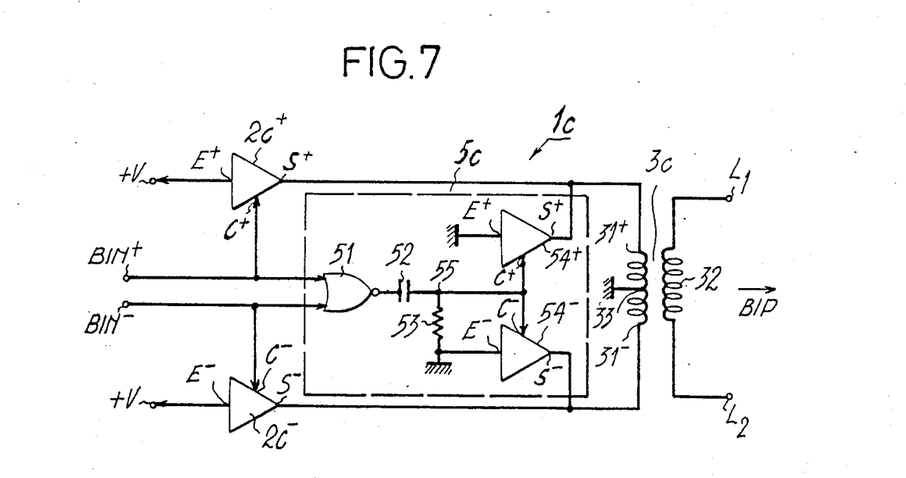
FIG. 7 shows a modified embodiment of the converter in FIG. 6.

In another version of the second embodiment shown in FIG. 7, the converter $1c$ comprises two other transfer gates $54^+$ and $54^-$ in place of transistor 54. Gates $54^+$ and $54^-$ have inputs $E^+$ and $E^-$ at 0 volt, control inputs $C^+$ and $C^-$ connected to terminal 55 common to capacitor 52 and resistor 53, and outputs $S^+$ and $S^-$ connected to the outputs of the first gates $2c^+$ and $2c^-$ and the first terminals of primary half-windings $31^+$ and $31^-$.

In this other version, gates $54^+$ and $54^-$ conduct at the beginning of pulses $i^+$, which allows a considerable reduction in the width $\tau$ of the pulses required to suppress the transient trailing of the rear edge of bipolar pulses $z^+$ and $z^-$ and in addition, to improve the performance of the converter, in particular as regards current consumption.

Figure 8:
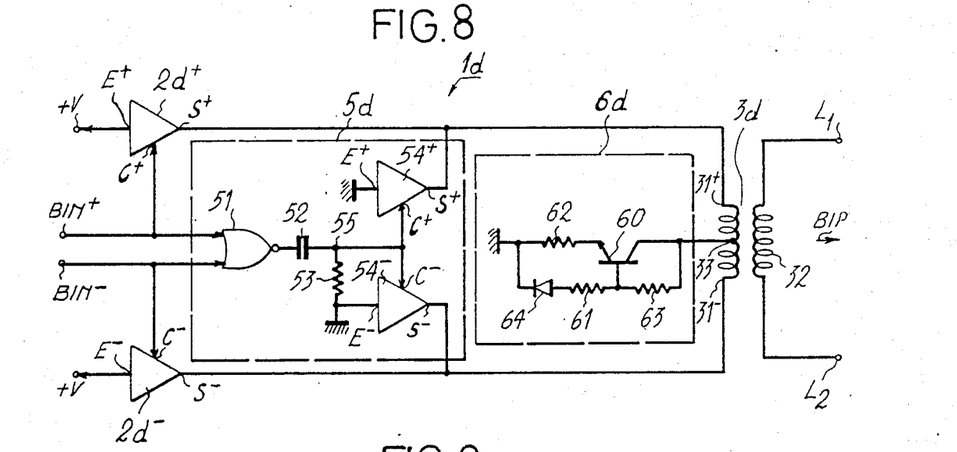
FIG. 8 shows a third embodiment of a binary-to-bipolar converter according to the invention.

In a third embodiment shown in FIG. 8, a binary-to-polar converter $1d$ comprises two transfer gates $2d^+$ and $2d^-$, a differential transformer $3d$ and a transient trailing suppression circuit $5d$ which are respectively similar to circuits $2c^+$, $2c^-$, $3c$ and $5c$ and are laid out in the same way as in converter $1c$ shown in FIG. 7. In converter $1d$ is provided a current source $6d$ which couples central terminal 33 of primary winding $31^+$, $31^-$ of transformer $3d$ to the reference terminal at 0 volt. Such a current source may also be included in the converters according to the invention, shown in FIGS. 3 to 6.

The current source $6d$ comprises an NPN bipolar transistor 60 having a collector connected to terminal 33, a first resistor 61 interconnected between a base of transistor 60 and the reference terminal, a second resistor 62 interconnected between an emitter of transistor 60 and the reference terminal, and a third resistor 63 connected to the base and collector of transistor 60.

The resistances of the three resistors 61, 62 and 63 and the operating characteristics of transistor 60 are chosen to comply with predetermined templates of the converter output impedance, i.e., predetermine variations in said output impedance as a function of the frequency or rate of the BIP bipolar signal. In particular such templates must be ensured for the particular application envisaged with respect to local area networks, when the bipolar signal is at high impedance state Z: in this case, transistor 60 is saturated and source $6d$ is equivalent to a true current source. When the bipolar signal is at the low impedance state $z^+$ or $z^-$, the current source $6d$ is not saturated and is equivalent to a voltage source imposing a predetermined output voltage. Source $6d$ can also operate as a current source and a voltage source for CH load impedances respectively less than and greater than a typical value of 50 ohms.

Preferably, source $6d$ comprises a diode 64 that is connected in series with the first resistor 61 and forward-biased from the base of transistor $6d$ to the reference terminal. The diode 64 is used for temperature compensation of the source. In another version, diode 64 is replaced by a thermistor, such as a negative temperature coefficient (NTC) resistor.

Figure 9:
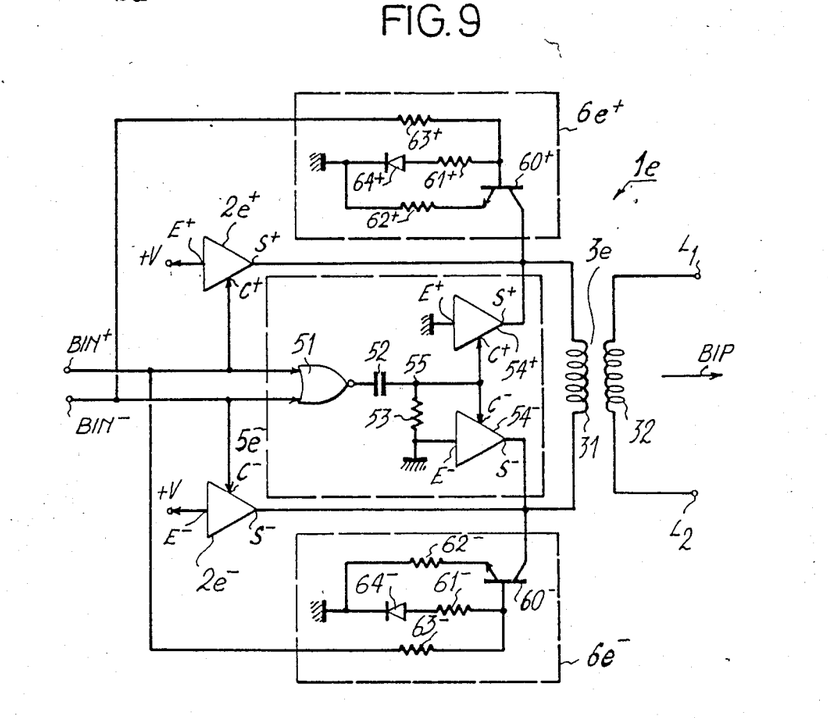
FIG. 9 shows a fourth embodiment of a binary-to-bipolar converter according to the invention.

With reference to FIG. 9, a fourth embodiment of binary-to-bipolar converter $1e$ comprises two transfer gates $2e^+$ and $2e^-$, a transformer $3e$ and a transient trailing suppression circuit $5e$ which are respectively similar to circuits $2c^+$ $2c^-$ $3c$ and $5c$ and are laid out in the same way as in converter $1c$ shown in FIG. 7, or in converter $1d$ shown in FIG. 8. In transformer $3e$, the primary winding 31 no longer comprises a central terminal 33, which thus allows a reduction in the distributed capacity of the transformer and to easier remedy the output impedance constraints in the converter.

In a fourth embodiment, the current source 6d which was included in converter 1d is replaced by two symmetrical current sources 6e+ and 6e−. Two such current sources may also be included in converters according to the invention shown in FIGS. 3 to 6.

Each source 6e+, 6e− comprises an NPN transistor 60+, 60−, a first resistor 61+, 61−, a second resistor 62+, 62− and a diode 64+, 64− having a cathode connected to the reference terminal, or a thermistor, that are laid out in the same way as components 60, 61, 62, and 64 in source 6d. Bases of transistors 60+ and 60− are connected to control terminals C− and C+ of gates 2e− and 2e+ receiving binary signals BIN− and BIN+, through third resistors 63+ and 63− respectively. Collectors of transistors 60+ and 60− are connected to outputs S+ of gates 2e+ and 54+ and to outputs S− of gates 2e− and 54−, respectively. Thus, source 6e+, 6e− is unblocked by the "1" states of binary signal BIN+, BIN− corresponding to the low impedance states at the output of the respective transfer gate 2e+, 2e−, while the output of the other transfer gate 2e−, 2e+ is at high impedance.

Figure 10:
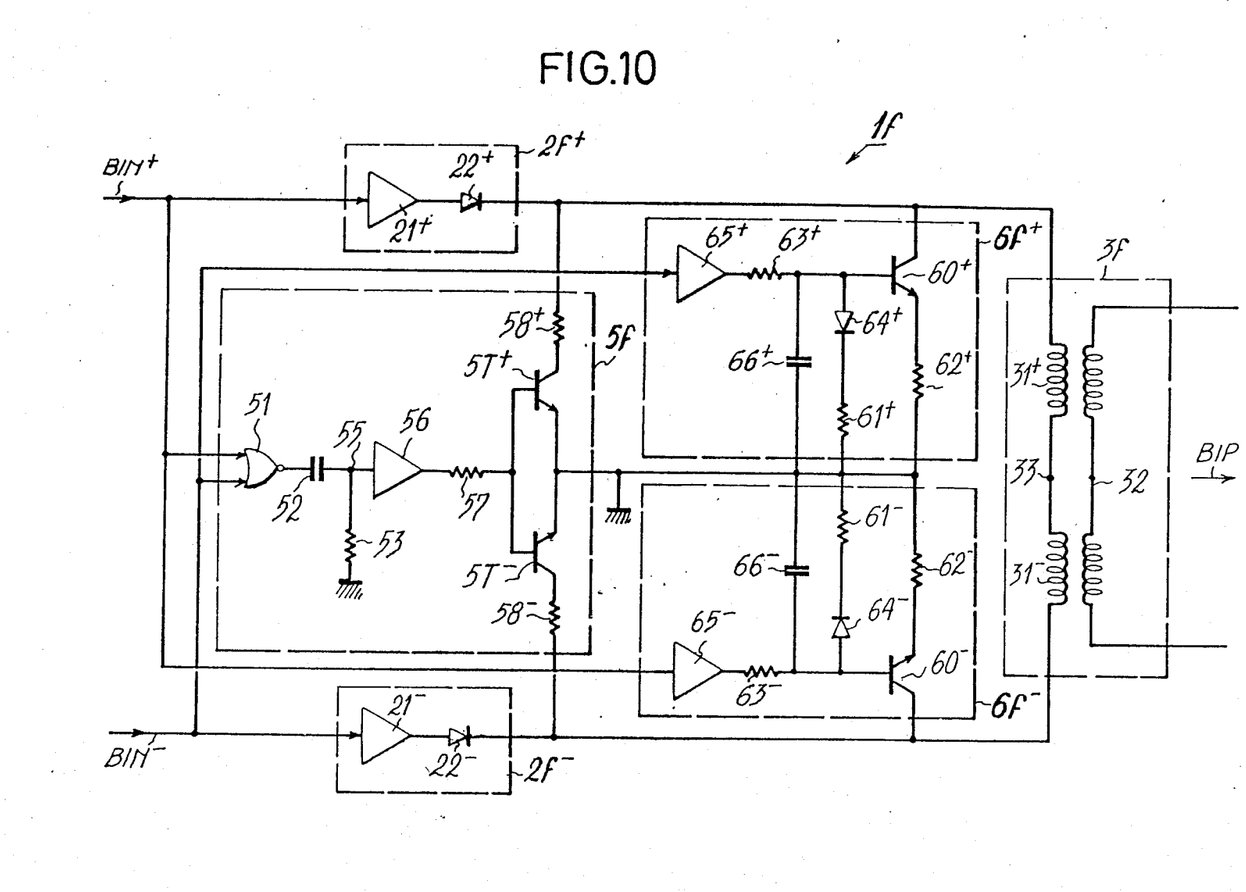
FIG. 10 shows a practical embodiment of the converter in FIG. 9.

FIG. 10 illustrates a practical embodiment of a binary-to-bipolar converter 1f corresponding to converter 1e. Converter 1f comprises two input circuits with gates 2f+ and 2f−, an output transformer 3f without central terminal in primary winding 31+-31− connected to the reference terminal, a transient trailing suppression circuit 5f, and two current sources 6f+ and 6f− that are laid out in the same way as circuits 2e+, 2e−, 3e, 5e, 6e− in converter 1e, in relation to the converter input terminals receiving binary signals BIN+ and BIN− and the primary winding.

Each circuit 2f+, 2f− comprises a buffer gate 21+, 21− and a diode 22+, 22− that are connected in series between the input of converter 1f receiving the respective binary signal BIN+, BIN− and the first terminal of the respective primary half-winding 31+, 31−. Gate 21+, 21− is used as a buffer gate to constitue an appropriate logic interface between CMOS technology logic circuits upstream of the converter and DTL or TTL technology logic circuits downstream of the circuit 2f+, 2f−, such as in particular a transistor 5T+, 5T− included in circuit 5f, as will be seen later on. This gate 21+, 21− guarantees the logic level characteristics, and therefore, the power supply voltages in the CMOS circuits and DTL or TTL circuits. Diode 22+, 22− has an anode connected to the output of buffer gate 21+, 21− and a cathode connected to the first terminal of half-winding 31+, 31− thereby being crossed by the BIN+, BIN− signal pulses and protecting the CMOS circuits from any line current in the opposite direction.

The transient trailing suppression circuit 5f comprises, on the input side, a NOR gate 51 having two inputs connected respectively to the inputs of buffer gates 21+ and 21−, and a differentiating circuit having capacitor 52 and resistor 53 and connected to the output of gate 51, as in circuit 5e. In circuit 5f are provided two NPN bipolar transistors 5T+ and 5T−, replacing transfer gates 54+ and 54− in circuit 5e. Emitters of transistors 5T+ and 5T− are connected to the 0 volt reference terminal. Bases of transistors 5T+ and 5T− are on the one hand interconnected, and on the other connected to the terminal 55 common to capacitor 52 and resistor 53, through a series combination including a buffer gate 56 and a base resistor 57. The collector of transistor 5T+, 5T− is connected to the cathode of respective diode 22+, 22− and to the first terminal of the respective primary half-winding 31+, 31− via a collector resistor of 58+, 58−. Gate 56 plays the same role as gates 21− and 21−. Transistors 5T+ and 5T− are in the conductive state or non-conductive state in the same way as gates 54+ and 54− already described with reference to FIG. 7.

The advantage of using transistors 5T+ and 5T− in particular lies in the ability to reduce the line power supply voltages for the low impedance states $z^+$ and $z^-$, and to offer an output impedance which can be easily calibrated thanks to the collector resistors 58+ and 58−, for the rear edges of bipolar pulses $z^+$ and $z^-$, thus calibrating the transitions from state z to state Z, corresponding to the fall time of the rear edges of the bipolar pulses.

Transistors 5T+ and 5T− and diodes 22+ and 22− also do away with the activation of the CMOS circuits upstream of the converter, thus avoiding unnecessary consumption by these circuits, when the power supply to these circuits is absent and line $L_1L_2$ is carrying a signal.

Each current source 6f+, 6f− comprises an NPN bipolar transistor 60+, three resistors 61+, 62+ and 63+, 61−, 62− and 63− and a diode 64+, 64− that are laid out in the same way as in source 6e+, 6e−, with in addition, an input buffer gate 65+, 65− and a capacitor 66+, 66−. Buffer gate 65+, 65− is connected in series with respective resistor 63+, 63− and has an input connected to the respective input of converter 1f receiving the other binary signal BIN−, BIN+; gate 65+, 65− plays a role similar to the other CMOS buffer gates already mentioned 21+, 21− and 56. Capacitor 66 is connected between the base of transistor 60+, 60− and the reference terminal, in parallel with the series combination of resistor 61+, 61− and diode 64+, 64−. Capacitors 66+ and 66− with resistors 63+ and 63− facilitate calibration of the rise time of the forward edges of the bipolar pulses, so as to reduce this rise time which is all the greater as the output impedance is high, but which should not be reduced too much, so that parasite overwaves can be eliminated during rising transitions.

What we claim is:

1. A binary-to-bipolar converter for receiving first and second binary signals, a first logic state being present in only one of said binary signals at any one time, said converter comprising:
   (a) first and second means for receiving said first and second binary signals and for delaying the drop from said first logic state to a second logic state in said first and second binary signals, respectively, thereby producing first and second delayed signals;
   (b) first and second transfer gates for receiving said first and second binary signals via inputs and said first and second delayed signals via control inputs for converting said first logic state of said first and second binary signals into first and second current bipolar pulses responsive to said first logic state of said first and second delayed signals, respectively, each of said first and second transfer gates being at a low output impedance state and a high output impedance state when the respective delayed signal is at the first and second logic states, respectively; and (c) means for transforming said first and second pulses into opposite polarity pulses of a bipolar signal transmitted in a transmission line.

2. The converter claimed in claim 1 wherein each of said first and second delaying means comprises an integrator circuit having a resistor and a capacitor, said resistor being connected between said input and said control terminal of the respective transfer gate.

3. The converter claimed in claim 2, wherein said integrator circuit comprises a diode connected in parallel with said resistor.

4. The converter claimed in claim 1, wherein each of said first and second delaying means comprises a bistable flip-flop having an input and an output connected to said input and said control terminal of the respective transfer gate, and a clock input receiving a high-frequency clock signal.

5. A binary-to-polar converter, comprising:
(a) first and second transfer gates having inputs raised to a predetermined voltage and control terminals receiving first and second binary signals, respectively, for converting a first logic state of said first and second binary signals into first and second current bipolar pulses corresponding to low output impedance states for said first and second transfer gates respectively, said first logic state only being present in one of said binary signals at any one time, and each of said transfer gates being at a high impedance state in response to a second logic state of said respective binary signal;
(b) means for detecting rear transitions from said first logic state to said second logic state in said first and second binary signals, said detecting means including a NOR gate having an input receiving said first and second binary signals, said NOR gate also including an output, and a differentiating circuit connected to said NOR gate output;
(c) means connected to outputs of said detecting means and said transfer gates for surprising a transient trailing of rear edges in said first and second pulses in response to the detected transitions; and
(d) means for transforming said first and second pulses in which a transient trailing of rear edges is suppressed, into opposite polarity pulses of a bipolar signal transmitted in a transmission line.

6. The converter claimed in claim 5, wherein said transient trailing suppressing means comprises a transistor having a gate electrode connected to an output of said detecting means, and two other electrodes connected respectively to said outputs of said transfer gates transmitting said first and second pulses.

7. The converter claimed in claim 5, wherein said transient trailing suppressing means comprises third and fourth transfer gates having inputs connected to a reference potential terminal, control inputs connected to an output of said detecting means, and outputs connected respectively to outputs of said first and second transfer gates.

8. A binary-to-bipolar converter, comprising:
(a) first and second means for converting a first logic state of first and second binary signals into first and second current bipolar pulses corresponding to low output impedance states for said first and second converting means, respectively, said first logic state only being present in one of said binary signals at any one time, and each of said converting means being at a high impedance state in response to a second logic state of said respective binary signal;
(b) a transformer for transforming said first and second pulses into opposite polarity pulses of a bipolar signal transmitted in a transmission line;
(c) first and second current sources having control terminals receiving respectively said second and first binary signals, and output terminals connected respectively to said outputs of said first and second converting means; and
(d) means connected to said first and second converting means for deriving steep rear edges in said first and second pulses.

9. The converter claimed in claim 8, wherein each of said current sources comprises a buffer gate on the control input.

10. The converter claimed in claim 8, wherein each of said current sources comprises at least one transistor and a series combination including a resistor and a diode connected between a gate electrode of said transistor and a reference potential terminal.

11. The converter claimed in claim 10, wherein the current source comprises a capacitor connected in parallel with said series combination.

12. The converter claimed in claim 8, wherein each of said current sources comprises at least one transistor and a series combination including a resistor and a thermistor connected between a gate electrode of said transistor and a reference potential terminal.

13. A binary-to-bipolar converter, comprising:
(a) first and second series combinations each including a buffer gate series-connected to a diode and respectively receiving first and second binary signals for supplying first and second bipolar pulses corresponding to a low output impedance state of said converter responsive to a first logic state of said first and second binary signals, respectively, said first logic state only being present in one of said binary signals and said converter being at a high impedance state responsive to a second logic state in said first and second binary signals;
(b) a transforming means including a primary winding having two terminals respectively connected to cathodes of said diodes in said series combinations, and a secondary winding transmitting said first and second bipolar pulses in a transmission line;
(c) means including a NOR gate receiving said first and secondary binary signals and a differentiating circuit connected to an output of said NOR gate for detecting rear transitions from said first logic state to said second logic state in said first and second binary signals;
(d) means connected to said cathodes of said diodes and an output of said differentiating circuit for suppressing a transient trailing of rear edges in said first and second bipolar pulses responsive to the detected rear transitions.

14. The binary-to-bipolar converter claimed in claim 13, wherein said suppressing means comprises first and second transistors having:
(1) gate electrodes connected to said output of said differentiating circuit;
(2) second electrodes connected to a potential referenced terminal; and
(3) third electrodes connected to said cathodes of said diodes via resistors, respectively.

15. The binary-to-bipolar converter claimed in claim 13, wherein said transforming means further comprises first and second current sources having control terminals receiving said second and first binary signals, respectively, and output terminals connected to said diode cathodes in said first and second series combinations, respectively.

16. The binary-to-bipolar converter claimed in claim 15, wherein each of said first and second current sources comprises:
   (a) an input buffer gate connected to said control terminal of said source;
   (b) a transistor having a gate electrode connected to an output of said input buffer gate, a second electrode connected to said respective diode cathode, and a third electrode connected to a potential reference terminal;
   (c) a diode and a resistor series-connected between said gate electrode of said transistor and said potential reference terminal, and
   (d) a capacitor connected between said gate electrode of said transistor and said potential reference terminal.

* * * * *